(12) United States Patent
Soh et al.

(10) Patent No.: US 9,241,417 B2
(45) Date of Patent: Jan. 19, 2016

(54) WATERPROOF STRUCTURE OF ELECTRICAL JUNCTION BOX

(75) Inventors: Shutoh Soh, Makinohara (JP); Kenta Kamiya, Makinohara (JP); Kouki Sato, Makinohara (JP)

(73) Assignee: Yazaki Corporation, Tokyo (JP)

( * ) Notice: Subject to any disclaimer, the term of this patent is extended or adjusted under 35 U.S.C. 154(b) by 558 days.

(21) Appl. No.: 13/450,611

(22) Filed: Apr. 19, 2012

(65) Prior Publication Data

US 2012/0267162 A1 Oct. 25, 2012

(30) Foreign Application Priority Data

Apr. 20, 2011 (JP) ................................. 2011-093970

(51) Int. Cl.
  *H02G 3/18* (2006.01)
  *H05K 7/02* (2006.01)
  *B60R 16/023* (2006.01)
(52) U.S. Cl.
  CPC ............ *H05K 7/026* (2013.01); *B60R 16/0238* (2013.01); *B60R 16/0239* (2013.01)
(58) Field of Classification Search
  CPC .......... H02G 3/08; H02G 3/18; H02G 3/088; H02G 3/086; H02G 3/16; H05K 7/026; B60R 16/02; B60R 16/0238; B60R 16/0239
  USPC ............ 174/21 R, 50, 60, 68.1, 665, 668, 66, 174/72 A, 50.5, 135, 659, 520, 152 G, 153 G, 174/655, 657, 658; 439/76.1, 76.2, 135, 439/136
  See application file for complete search history.

(56) References Cited

U.S. PATENT DOCUMENTS

| | | | |
|---|---|---|---|
| 6,911,600 B2* | 6/2005 | Kiyota et al. ................. | 174/668 |
| 7,369,381 B2* | 5/2008 | Tsukamoto et al. ........ | 174/72 A |
| 7,422,443 B2* | 9/2008 | Kaneko et al. ............... | 439/76.2 |
| 7,586,038 B2* | 9/2009 | Kanamaru et al. ............. | 174/50 |
| 7,934,934 B2* | 5/2011 | Taniguchi et al. ........... | 439/76.1 |
| 8,124,887 B2* | 2/2012 | Suzuki .......................... | 174/481 |
| 2003/0221855 A1* | 12/2003 | Rix .............................. | 174/65 G |
| 2010/0084854 A1* | 4/2010 | Sathyanarayana et al. ..... | 285/84 |
| 2010/0288757 A1* | 11/2010 | Akahori ......................... | 220/3.7 |
| 2011/0045684 A1* | 2/2011 | Morino et al. ................ | 439/357 |

FOREIGN PATENT DOCUMENTS

| | | | | |
|---|---|---|---|---|
| JP | 2006-320131 A | | 11/2006 | |
| JP | 2007-041808 | * | 2/2010 | .............. H02G 3/16 |
| JP | 2010-041808 A | | 2/2010 | |
| JP | 2010-093882 A | | 4/2010 | |

* cited by examiner

*Primary Examiner* — Ishwarbhai B Patel
*Assistant Examiner* — Paresh Paghadal
(74) *Attorney, Agent, or Firm* — Locke Lord LLP (57) ABSTRACT

The waterproof structure of an electrical junction box herein prevents water from entering into the electrical junction box. The electrical junction box includes a main body having a groove formed on an outer wall thereof and a tubular wire cover composed of front and rear split covers. Electric wires are passed downward through the wire cover and fixed to a lower portion of the wire cover using a tape. The wire cover is slidably engaged with the groove of the junction box main body. The waterproof structure includes a step portion as a water stop formed on a rear wall of the wire cover. The rear wall is arranged in contact with or adjacent to a back wall of the groove so that the step portion prevents water from entering into the electrical junction box from bottom along the back wall of the groove through the electric wire.

8 Claims, 5 Drawing Sheets

WATERPROOF STRUCTURE OF ELECTRICAL JUNCTION BOX

CROSS REFERENCE TO RELATED APPLICATION

The priority application Japanese Patent Application No. 2011-093970 upon which this patent application is based is hereby incorporated by reference.

BACKGROUND OF THE INVENTION

1. Field of the Invention

The present invention relates generally to a waterproof structure of a wire cover of an electrical junction box which prevents water from entering into the electrical junction box from bottom through an electric wire extending downward from the electrical junction box.

2. Description of the Related Art

Conventionally, there have been proposed various wire covers for an electrical junction box. Such wire covers function to lead out an electric wire connected to a connecting portion in the electrical junction box, while protecting the electric wire from water or outside interference by covering the electric wire.

An example of such wire cover is disclosed in Japanese Patent Application Publication No. 2006-320131, wherein a large-diameter electric wire is passed downward through a recess formed on a side wall of an electric junction box main body, in which an upper terminal of the electric wire is bolted to a connecting portion of the electric junction box, and a side cover, i.e. a wire cover, is slidably engaged with grooves on both sides of the recess so that the electric wire is fixed by a band on a partition wall of the side cover.

Furthermore, in Japanese Patent Application Publication No. 2010-41808, a large-diameter electric wire is passed downward through a recess formed on a housing of an electric junction box, a terminal of the electric wire is connected to a mating terminal in the housing a nut, the electric wire is provided with a waterproof elastic sheet arranged on a circumference of the electric wire, and a wire cover is slidably mounted to the recess of the housing. In such a manner, inside of the wire cover is made watertight with the waterproof elastic sheet.

Furthermore, Japanese Patent Application Publication No. 2010-93882 discloses an electrical junction box having a junction box main body having a side opening and a side cover, i.e. a wire cover, in which a plurality of small-diameter electric wires are banded together and fixed to the side cover. The side cover is slidably engaged with the side opening of the junction box main body so that the electric wires are lead out of a lower portion of the side cover. The side opening is provided with a downwardly-slanted waterproof wall arranged inside the side opening, thereby preventing water from entering from bottom.

However, the conventional wire cover disclosed in Japanese Patent Application Publication No. 2006-320131 described above has a drawback that splattered water or high-pressure washing water may enter into the electrical junction box from bottom through the electric wire. Also, the conventional wire cover disclosed in Japanese Patent Application Publication No. 2010-41808 described above has a drawback that the use of the waterproof elastic sheet causes an increase in the number of components and thus increases the cost. Also, the conventional wire cover disclosed in Japanese Patent Application Publication No. 2010-93882 described above has a drawback that, since the waterproof wall is provided with a projected end which is in contact with the circumference of the electric wire, the waterproof performance is decreased if the number of the electric wires used is small.

Figure 10A:
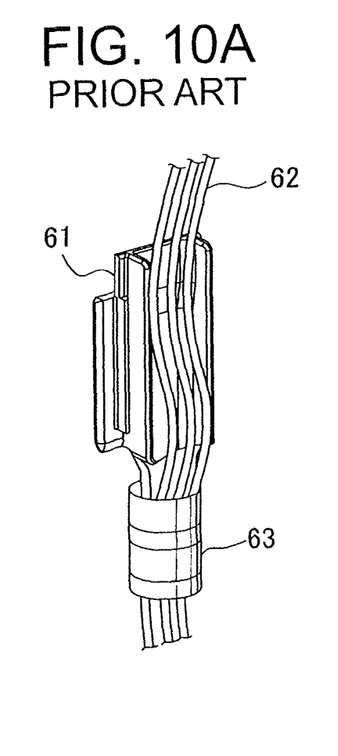
FIG. 10A is a perspective view of a wire cover structure of an electrical junction box according to a conventional art.
Figure 10B:
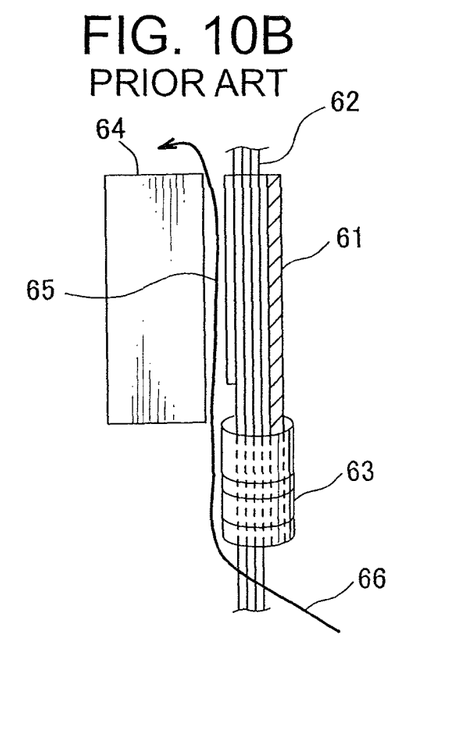
FIG. 10B is a longitudinal cross section of FIG. 10A showing an entry pathway of water.

In another conventional wire cover of an electrical junction box shown in FIGS. 10A and 10B, a plurality of electric wires 62 is passed through a gutter-shaped side cover or wire cover 61 and fixed to a lower portion of the wire cover 61 using a tape 63, the wire cover 61 is slidably engaged with a junction box main body 64 with the electric wires 62 being placed medially, and the electrical junction box is mounted to a motor vehicle. In this example, there is a problem that if the number of the electric wires 62 is small, then splattered water 66 or high-pressure washing water 66 may enter into the junction box main body 64 from bottom along the electric wires 62 through a space 65 between the electric wires 62 and the junction box main body 64.

SUMMARY OF THE INVENTION

In view of the above-described problems, an object of the present invention is to provide a waterproof structure of an electrical junction box which is simple and low in cost and which can reliably prevent water from entering into the electrical junction box from bottom through the electric wires even if the number of the electric wires is small (that is, there is a space between the electric wires and the junction box main body).

In order to achieve the above-mentioned object, the present invention provides, according to one exemplary embodiment, a waterproof structure of an electrical junction box having a junction box main body and a tubular wire cover, the junction main body having a groove fanned on an outer wall of the junction box main body, and the wire cover being slidably engaged with the groove of the junction box main body, wherein an electric wire is passed downward through the wire cover and fixed to a taping portion located at a lower portion of the wire cover using a tape, the waterproof structure including a step portion as a water stop formed on a rear wall of the wire cover, wherein the rear wall of the wire cover is arranged in contact with or adjacent to a back wall of the groove of the junction box main body so that the step portion prevents water from entering into the electrical junction box from bottom along the back wall of the groove through the electric wire.

According to the structure described above, the electric wire is passed downward through the tubular wire cover, and the rear wall of the wire cover is arranged in contact with or adjacent to the back wall of the groove. Thus, since the electric wire is arranged not in contact with the back wall of the groove, even if the number of electric wires is small and there is a space created between the electric wires and the junction box main body, there is provided reliable waterproof property. Furthermore, an outer face (i.e. a bottom face) of the step portion of the wire cover is positioned perpendicular or substantially perpendicular to the back wall of the groove. Thus, water which has entered from bottom along the rear wall of the wire cover through the electric wire is stopped by the outer face of the step portion and falls down. Thus, the water directed upward toward the wire cover can be prevented from entering into the electrical junction box. In addition, the step portion of the wire cover can be formed easily by, for example, integral molding using synthetic resin. Furthermore, the step portion eliminates the need for providing a waterproof means such as a waterproof packing, thereby reducing the manufacturing cost of the electrical junction box.

In another embodiment, the rear wall of the wire cover has a curved cross section, and the step portion is arranged at a bottom end of the rear wall and on both widthwise sides of the rear wall, wherein the step portion at the bottom end of the rear wall is continuous with the taping portion located at the lower portion of the wire cover.

According to the structure described above, the water can be stopped in a reliably manner by the step portions provided at the bottom end of the rear wall and on both widthwise sides of the rear wall. The step portions on both sides of the rear wall function to stop the water which has entered through the both sides of the step portion provided at the bottom end of the rear wall having the curved cross section. Thus, by providing the plurality of step portions at the center of and on both sides of the wire cover, the water can be stopped in a reliable manner. Preferably, the step portions on both sides of the rear wall are arranged in two rows, one above the other, so that the water can be stopped in a more reliable manner.

In yet another embodiment, the wire cover is provided with a flange as a water stop arranged at an upper end of the wire cover so that the flange abuts on an upper edge of the groove.

According to the structure described above, even if the water has passed through the step portion in an upward direction, the water is stopped by a bottom face of the flange and falls down. Thus, the water can be prevented from entering into the electrical junction box in a more reliable manner.

In yet another embodiment, the wire cover is provided with a locking protrusion arranged at the rear wall of the wire cover below the flange so that the locking protrusion engages with the back wall of the groove.

According to the structure described above, the water which has passed through the step portion can be stopped by a bottom face of the locking protrusion and falls down. Thus, the water can be prevented from entering into the electrical junction box in a more reliable manner.

In yet another embodiment, the wire cover is composed of a front split cover and a rear split cover which are combined together to form the wire cover, wherein the rear split cover is provided with the step portion, the flange and the locking protrusion. The flange may be arranged at an upper end of the rear split cover so as to abut on an upper edge of the groove, and the locking protrusion may be arranged at the rear wall of the wire cover below the flange so as to engage with the back wall of the groove.

According to the structure described above, the step portion, the flange and the locking protrusion can be formed in a lump using synthetic resin. Furthermore, the electric wire can easily be passed through the wire cover by separating (i.e. opening) the front split cover and the rear split cover, followed by combining the front and rear split covers together to form the tubular wire cover. The front and rear split covers are fixed to each other by a locking means. Thus, the formability of the wire cover using synthetic resin is improved, thereby reducing the manufacturing cost of the wire cover.

Furthermore, in yet another embodiment, the present invention provides a waterproof structure of an electrical junction box having a junction box main body and a tubular wire cover, the junction main body having a groove formed on an outer wall of the junction box main body, and the wire cover being slidably engaged with the groove of the junction box main body, wherein an electric wire is passed downward through the wire cover and fixed to a lower portion of the wire cover using a tape, the waterproof structure including a step portion as a water stop formed on a back wall of the groove of the junction box main body, wherein a rear wall of the wire cover is arranged in contact with or adjacent to the back wall of the groove of the junction box main body so that the step portion formed on the back wall of the groove prevents water from entering into the electrical junction box from bottom along the back wall of the groove through the electric wire.

According to the structure described above, the electric wire is passed downward through the tubular wire cover, and the rear wall of the wire cover is arranged in contact with or adjacent to the back wall of the groove. Thus, since the electric wire is arranged not in contact with the back wall of the groove, even if the number of electric wires is small and thus there is a space created between the electric wires and the junction box main body, reliable waterproof property can be provided. Furthermore, an outer face (i.e. a bottom face) of the step portion of the back wall of the groove is arranged perpendicular or substantially perpendicular to the back wall of the groove. Thus, water which has entered from bottom along the rear wall of the wire cover through the electric wire is stopped by the outer face of the step portion and falls down. Thus, the water directed upward toward the wire cover can be prevented from entering into the electrical junction box. In addition, the step portion of the junction box main body can be formed easily by, for example, integral molding using synthetic resin. Furthermore the step portion eliminates the need for providing a waterproof means such as a waterproof packing, thereby reducing the manufacturing cost of the electrical junction box.

DETAILED DESCRIPTION OF THE INVENTION

FIGS. 1 through 9 show an exemplary embodiment of a wire cover waterproof structure of an electrical junction box according the present invention.

Figure 1:
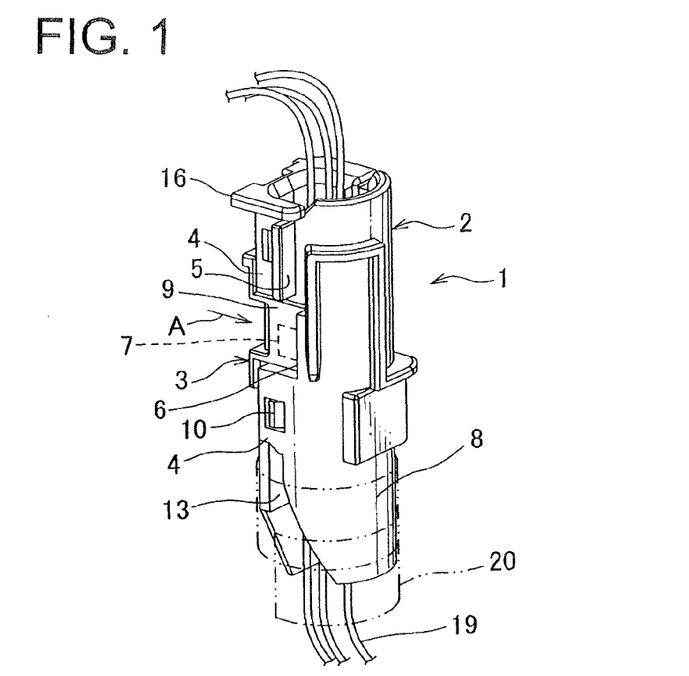
FIG. 1 is a front perspective view of a wire cover used in a wire cover waterproof structure of an electrical junction box of the present invention according to one exemplary embodiment.

Referring to FIG. 1, a wire cover 1 (referred also as a side cover) is formed into a tubular shape by a front split cover 2 and a rear split cover 3 which are made of synthetic resin and which are combined together. The front split cover 2 is formed into a gutter-like shape and has a semi-circular cross section. The front split cover 2 includes flexible engagement pieces 4 provided on the left, right, top and bottom with respect to each other as shown, in other words, the pairs of engagement pieces 4 are arranged on the left and right or on the top and bottom with respect to each other. The front split cover 2 further includes a pair of guide plates 5 projecting outward from both sides of the upper pair of engagement pieces 4, a locating plate 7 disposed between the upper and the lower engagement pieces 4 and projecting from a split end face 6, and a taping portion 8 located at a lower portion of the front split cover 2 and having a spatula-like shape with both right and left sides of the taping portion 8 being tapered.

The rear split cover 3 is formed into a rectangular gutter-like shape and is provided with a protrusion 10 arranged to engage with the engagement piece 4. The protrusions 10 are located on an outer face of a straight side wall 9 on both sides of the rear split cover 3 and are arranged on the left, right, top and bottom with respect to each other. The rear split cover 3 further includes an inner recess (shown with the reference sign 7) formed on the side wall 9 between the upper and the lower protrusions 10. This inner recess is arranged so that the locating plate 7 is inserted into and engaged with the inner recess.

Figure 2:
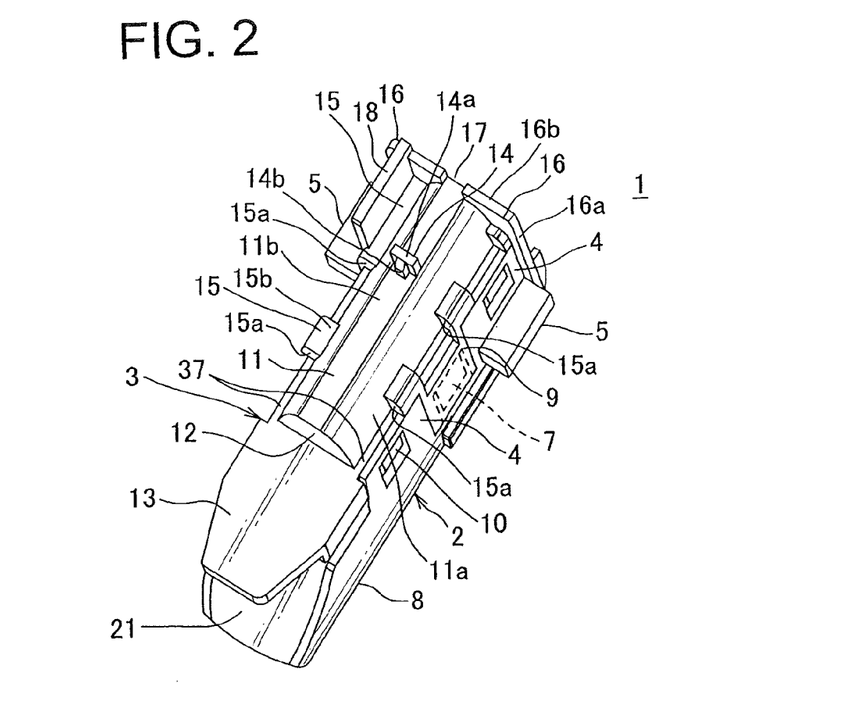
FIG. 2 is a back perspective view of the wire cover seen in a direction indicated by an arrow A in FIG. 1.

Referring to FIG. 2 showing the wire cover 1 seen from a direction indicated by an arrow A in FIG. 1, the rear split cover 3 includes a rear wall 11 having a curved cross section, and flat and narrow wall portions 37 located on both right and left sides of the rear wall 11 and communicated with the rear wall 11. The rear split cover 3 further includes an arch-like step portion 12 at a bottom end of the rear wall 11. Also, the rear split cover 3 includes total of four protruded walls 15 located above the step portion 12 and on the right and left sides of the rear wall 11. The protruded walls 15 are arranged in pairs so that one pair is positioned above the other. The respective protruded walls 15 have a lower step portion 15a. The protruded wall 15 extends over the wall portion 37 and over an edge portion 11a of the rear wall 11 in a width direction of the rear wall 11, so that a top face 15b of the protruded wall 15 is not higher than a top face 11b of the rear wall 11. The step portions 15a of the protruded wall 15 are located on the right and left sides of the arch-like step portion 12 to assist the step portion 12. The horizontal or substantially horizontal lower face (indicated by the reference signs 12 and 15a) of each of the step portions 12, 15a functions as a water-stop face.

Furthermore, the rear split cover 3 is provided with a flexible, flat-plate like taping portion 13 located below the step portion 12 and extending from the rear wall 11, a locking protrusion 14 located at an upper portion of the rear wall 11 between the upper left-and-right protruded walls 15 and arranged for a later-described junction box main body, a flange 16 located at an upper end of the rear split cover 3 above the locking protrusion 14, and a rib 18 located below the one side (e.g. the right hand side in this example) of the flange 16 and extending perpendicular to the flange 16. There is provided a cutout portion 17 formed on the rearward flange 16 for formation of the locking protrusion 14.

The flange 16 includes left and right flanges 16a and a rear flange 16b which are located on left and right sides and at a rear side of the upper end of the rear split cover 3, respectively. A front end of the left and right flanges 16a extends to a front end position of the guide plate 5. Thus, at least the step portions 12, 15a and the flange 16 of the rear split cover 3 are arranged to function as a water-stop wall.

The locking protrusion 14 includes a horizontal plate 14a and a narrow, slanted rib 14b connected to a lower central portion of the plate 14a. An upper face of the plate 14a functions as a locking face, and the slanted rib 14b functions as a slidably-contacting guide face with respect to a later described engagement portion of the junction box main body. Also, a lower face of the horizontal plate 14a and a lower face of the rib 14b function as a water-stop face. Alternatively, the cutout portion 17 of the flange 16 can be eliminated by changing the direction of formation of the locking protrusion 14.

In an assembly, for example, while the both front and rear split covers 2, 3 are in an opened position, the plurality of electric wires 19 is inserted through an internal space of the wire cover 1, as shown in FIG. 1. The both front and rear split covers 2, 3 are then combined and put in a closed position. An adhesive tape 20 made of synthetic resin is wound multiple times around the taping portions 8, 13 and around an outer circumference of a wire bunch 19 to fix the wire bunch 19 to the taping portions 8, 13. In addition, in such a manner a lower opening 21 of the wire cover 1 (shown in FIG. 2) is closed by the adhesive tape 20, thereby preventing water from entering into the lower opening 21.

Figure 3:
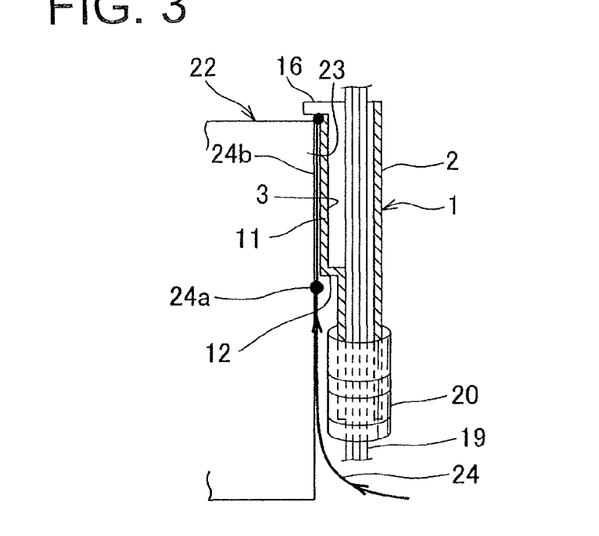
FIG. 3 is an explanatory schematic longitudinal sectional view showing a waterproof mechanism of the wire cover.

Referring to FIG. 3, when the wire cover 1 is slidably attached to an junction box main body 22, an outer face of the rear wall 11 of the rear split cover 3 is arranged in contact with or adjacent to an outer face of a wall 23 of the junction box main body 22. In this manner, the step portion 12 located at the lower central portion of the rear split cover 3 functions as a water-stop wall, or a water-stop face, thereby stopping the splattered water 24 entering from the bottom along the rear split cover 3. As shown in FIG. 3, the water 24 is stopped at a blocking portion 24a.

Furthermore, if there exists water 24b which has entered from bottom along the rear wall 11 and which has passed over the step portion 12, then the flange 16 located at the upper end of the rear split cover 3 as well as the locking protrusion 14 (shown in FIG. 2) located below the flange 16 function as a water-stop wall to stop the water 24b. In addition, the water 24b which has entered upward through both sides of the step portion 12 is stopped by the respective left and right step portions 15a of the upper and lower protruded walls 15 located above the step portion 12.

With the structure described above, the splattered water 24 or the high-pressure washing water 24 can be prevented from entering into the junction box main body 22. Furthermore, by using the wire cover 1 divided into two components, i.e. the front split cover 2 and the rear split cover 3, the lower opening 21 (shown in FIG. 20) of the wire cover 1 is closed by the adhesive tape 20 even if the number of the electric wires 19 is small. Thus, the water can be securely stopped regardless of the number of the electric wires 19 by the step portions 12, 15a and the flange 16.

In an alternative embodiment, at least a step portion 12 may be arranged at the junction box main body 22 instead of at the wire cover 1. In this case however, it is possible that when slidably mounting the wire cover 1, the taping portion 20 may interfere with the step portion provided at the junction box main body 22.

Figure 4:
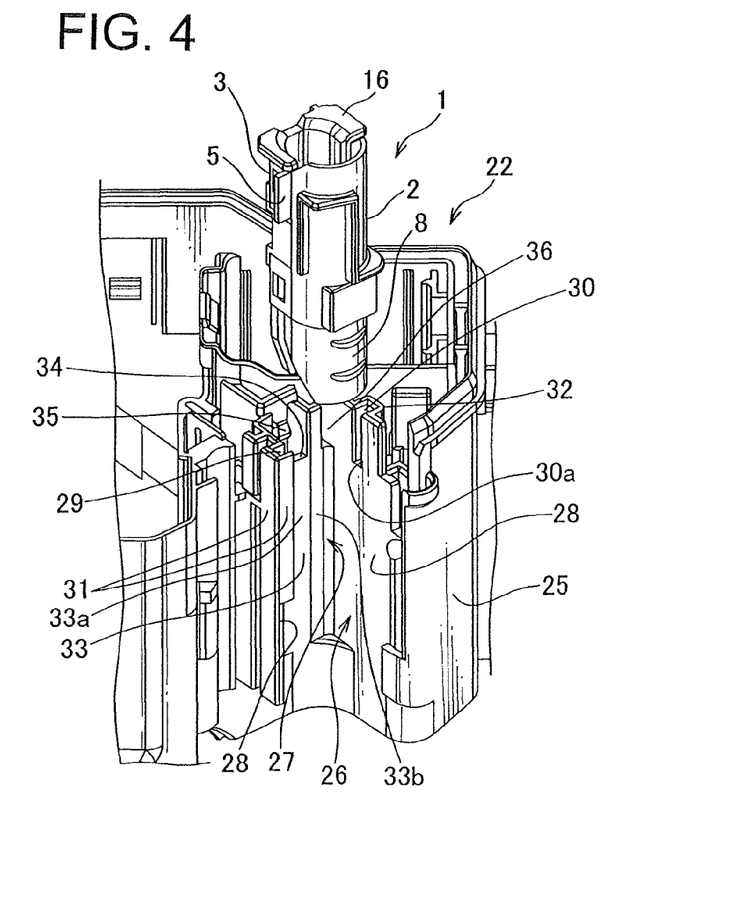
FIG. 4 is an exploded perspective view of the wire cover being mounted to the junction box main body.

Referring now to FIG. 4, the junction box main body 22 according to this example corresponds to a frame 22 of an electrical junction box made of synthetic resin. The frame 22 is provided with a side wall or a peripheral wall 25 and a vertically penetrating internal space surrounded by the peripheral wall 25. The peripheral wall 25 includes an outer wall or a recessed wall 26 having a large recess. The recessed wall 26 has a small, vertically penetrating groove 27 located at an inner side of the recessed wall 26 to which the wire cover 1 is slidably mounted in a downward direction.

Figure 5:
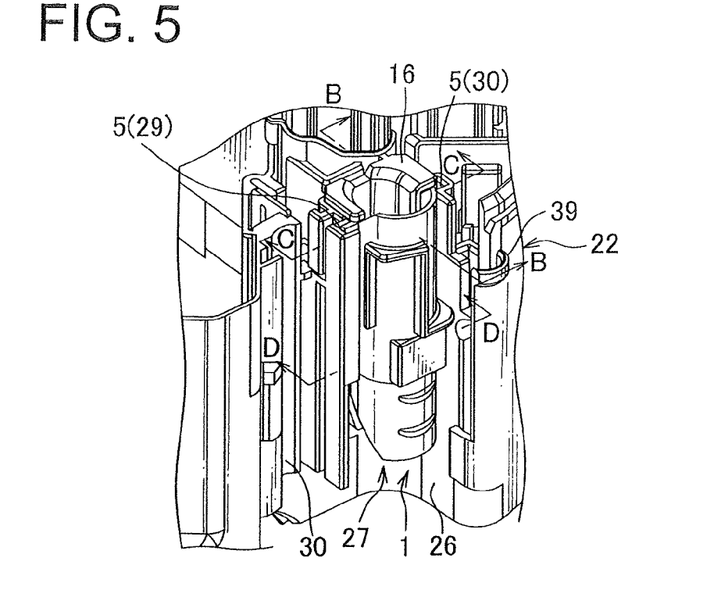
FIG. 5 is a perspective view of the wire cover being mounted to the junction box main body.

A pair of vertical guide grooves 29, 30 is provided at a vertical wall 28 on both sides of the groove 27. The guide groove 29 on the left hand side, in this example, is formed into a C-like cross section with vertically extending long walls 31 located in front, rear and left sides, while the guide groove 30 on the right hand side is formed into an inverted C-like cross section with vertically extending short walls 32 located in front, rear and right sides. The directions described above are with respect to FIG. 4. In addition, the right guide groove 30 has a stopper face 30a at a bottom end thereof. As shown in FIG. 5, the left and right guide plates 5 of the wire cover 1 are arranged so as to slidably engage with the guide grooves 29, 30, respectively.

Referring again to FIG. 4, the groove 27 includes a vertical back wall 33 having a central wall face 33a located at widthwise center of the groove 27. The central wall face 33a has a curved cross section and is arranged so as to contact with the curved cross-sectional rear wall 11 of the wire cover 1. There is provided a rectangular cutout portion 34 formed at a center of an upper end of the back wall 33 of the groove 27. Furthermore, there is provided a flexible engagement arm 35 arranged on a wall behind the cutout portion 34 and having a protrusion at a lower end of the engagement arm 35. The back wall 33 of the groove 27 further includes vertical flat wall faces 33b located at both left and right sides of the curved central wall face 33a. Furthermore, a second guide groove 36 is provided at the flat wall face 33b on the right hand side of the cutout portion 34.

As shown in FIG. 5 in which the wire cover 1 is mounted to the junction box main body 22, the rear wall 11 of the wire cover 1 is arranged in contact with or adjacent to the curved central wall face 33a of the back wall 33 of the groove 27 of the junction box main body 22 so that the step portion 12 of the rear wall 11 is arranged perpendicular or substantially perpendicular to the curved central wall face 33a. Also, the left and right wall portions 37 of the rear wall 11 are arranged adjacent to the left and right wall faces 33b of the back wall 33 of the groove 27, respectively, while the left and right protruded walls 15 are arranged in contact with or adjacent to the left and right wall faces 33b so that the step portions 15a of the protruded walls 15 is arranged perpendicular or substantially perpendicular to the left and right wall faces 33b.

Furthermore, the locking protrusion 14 (shown in FIG. 2) of the wire cover 1 is engaged with the protrusion (indicated with the reference sign 35) of the engagement arm 35 (shown in FIG. 4), while the rib 18 of the wire cover 1 is inserted downward into the second guide groove 36 and is engaged with the second guide groove 36. The flange 16 located at the upper end of the wire cover 1 abuts on an upper edge of the groove 27. Referring to FIG. 5, another wire cover (not shown) is slidably engaged with a groove located at a left of the wire cover 1 in a parallel manner. In an alternative embodiment, the plate 5 and the rib 18 may be provided to the frame 22, while the respective guide grooves 29, 30 may be provided to the wire cover 1. Thus, the plate 5, the rib 18 and the guide grooves 29, may be arranged suitably in an arbitral manner.

Referring to FIG. 4, a junction block (not shown) is slidably mounted inside the frame 22 in an upward direction. The junction block includes mount portions for each of a fusible link (i.e. a fuse), a relay and a connector, a bus bar made of conductive metal, a bolt-shaped terminal extending from the bus bar and a hole for the bolt-shaped terminal of the bus bar. For example, an electric wire 19 connected to the connector which is lead out from a mating connector, or an electric wire 19 having a terminal screwed to the bolt-shaped terminal, is inserted downward through the wire cover 1 and lead out from the lower opening 21 (shown in FIG. 2) of the wire cover 1.

Referring again to FIG. 5, there are provided vertical guide portions 39 located at left and right ends of the recessed wall 26 of the frame 22 (in the drawing, only a right guide portion 39 is shown). Thus, with the wire cover 1 being mounted, a plate-like outer cover (not shown) made of synthetic resin is mounted to the frame 22 so that engagement portions at left and right sides of the plate-like outer cover are slidably engaged with the guide portion 39 in the downward direction to form an inner space with the recessed wall 26. Thus, the recessed wall 26 is provided with the inner space opened in the vertical direction and having an upper opening and a lower opening. The upper opening of the recessed wall 26 is then covered by a portion of an upper cover made of synthetic resin (not shown) mounted on a top of the frame 22.

Furthermore, when a lower cover made of synthetic resin is mounted at a lower portion of the frame 22, the lower opening of the recessed wall 26 is kept open, so that the electric wires 19 extending downward from the wire cover 1 are lead out through the lower opening of the recessed wall 26. Therefore, even if water such as the splattered water or the high-pressure water has entered into the outer cover through the lower opening, each of the above-described step portions 12, 15a and the flange 16 serves to present the water from entering into the frame 22. The electrical junction box according to this exemplary embodiment is composed of the above-described frame 22, the junction block, the outer cover, the upper cover, the lower cover and the wire cover 1.

Figure 6:
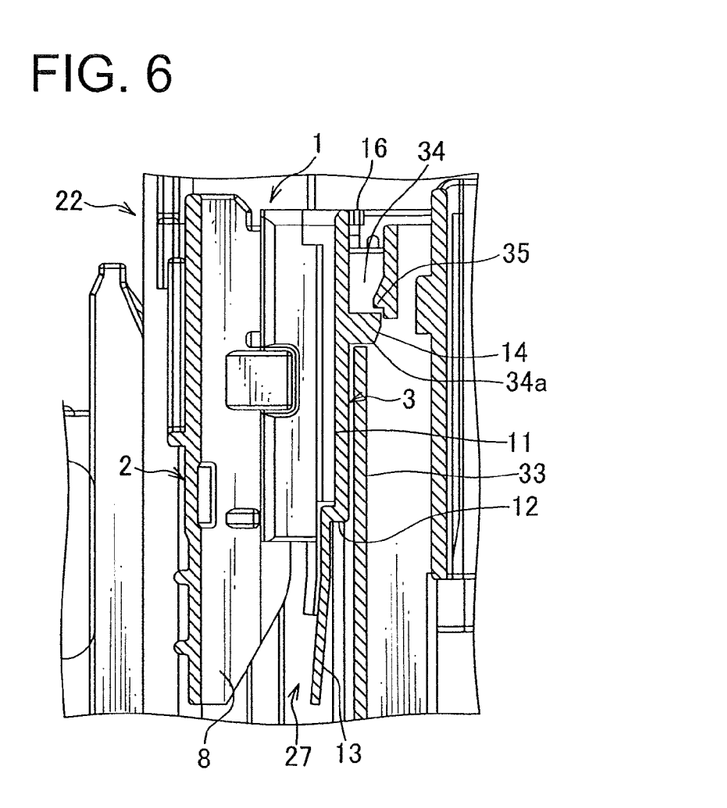
FIG. 6 is a cross sectional view along the line B-B of FIG. 5.

Referring now to FIG. 6 showing a cross sectional view along the line B-B at the center of the wire cover 1 of FIG. 5, the rear wall 11 of the wire cover 1 is arranged adjacent to and slightly spaced from the back wall 33 of the groove 27 of the frame 22, or alternatively the rear wall 11 of the wire cover 1 may be in contact with the back wall 33 of the groove 27, so that a horizontal lower face of the step portion 12 located at the bottom end of the rear wall 11 of the wire cover 1 stops the water. The taping portion 13 which is continuous with the step portion 12 is positioned opposed to the back wall 33 of the groove 27 with a large space. Furthermore, the locking protrusion 14 of the wire cover 1 is placed in the cutout portion 34 located above the back wall 33 of the groove 27 and is engaged with a horizontal lower face (i.e. an engagement face) of the protrusion of the engagement arm 35 in the cutout portion 34. As a result, the wire cover 1 is prevented from being removed upward. The lower face of the locking protrusion 14 is arranged to abut on a lower end 34a of the cutout portion 34. Thus, the locking protrusion 14 seals the space between the rear wall 11 of the wire cover 1 and the back wall 33 of the groove 27 at the top of the space to stop water. Furthermore, the flange 16 is located above the locking protrusion 14 at left and right sides of the locking protrusion 14 to further stop the water.

Figure 7:
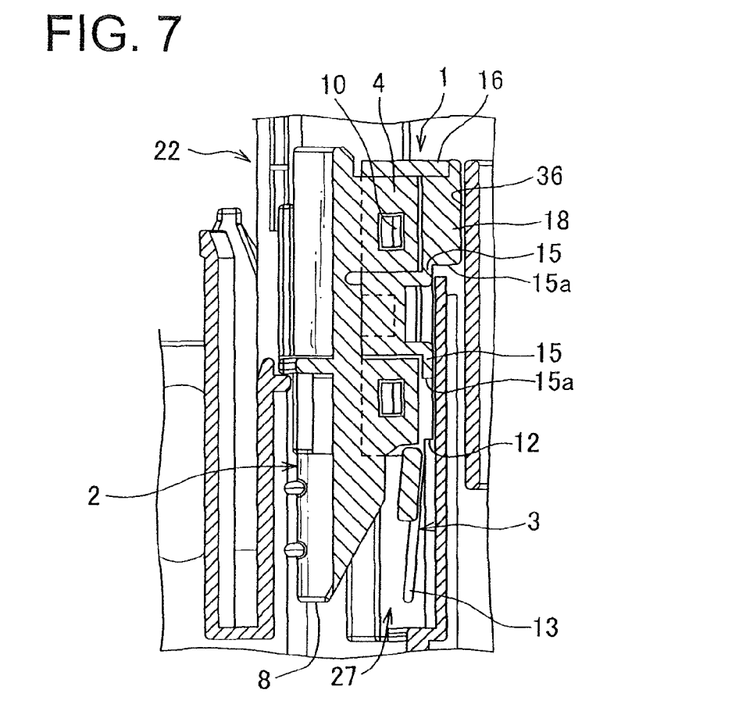
FIG. 7 is a cross sectional view along a line slightly displaced from the line B-B of FIG. 5.

Referring to FIG. 7 showing a cross sectional view along a line slightly displaced with respect to the B-B line of FIG. 5, the lower and the upper step portions 15a are positioned at left and right sides of and above the step portion 12 of the wire cover 1. Furthermore, the rib 18 is positioned integrally on the upper portion of the right upper step portion 15a, so that the rib 18 is engaged with the second guide groove 36 of the groove 27 of the frame 22. In addition, the flange 16 extends rearward to an upper end of the rib 18.

Figure 8:
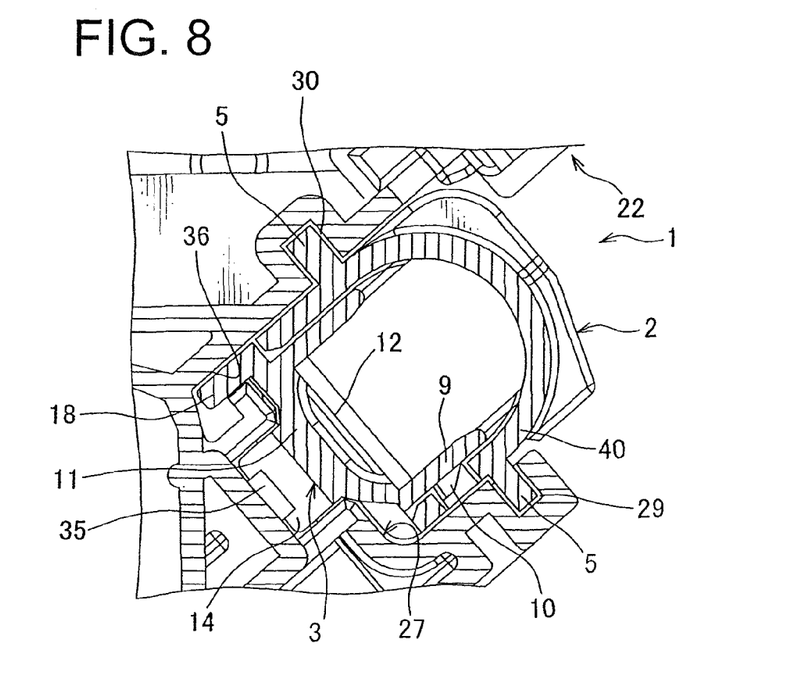
FIG. 8 is a cross sectional view along the line C-C of FIG. 5.

Referring to FIG. 8 showing a cross sectional view along the C-C line of FIG. 5, the left and right side walls 9 of the rear split cover 3 are inserted into and engaged with an inner side of left and right side walls 40 of the front split cover 2. Specifically, the pair of left and right guide plates 5 of the front split cover 2 is slidably engaged with the left and right guide grooves 29, 30 formed in the groove 27 of the frame 22, while the rearward-extending rib 18 of the rear split cover 3 is inserted into and engaged with the second guide groove 36 of the groove 27 adjacent to the back wall 33. Furthermore, the protrusion of the engagement arm 35 is engaged with the upper face of the locking protrusion 14 of the rear split cover 3. The step portion 12 projects radially from an inner side of the rear split cover 3 such that an upper face (indicated by the reference sign 12 in FIG. 8) of the step portion 12 is exposed. The flange 16 (not shown in FIG. 8) is positioned above the left and right guide plates 5 and above the rear wall 11 of the rear split cover 3. In FIG. 8, the electric wires inside the wire cover 1 is eliminated for simplicity.

Figure 9:
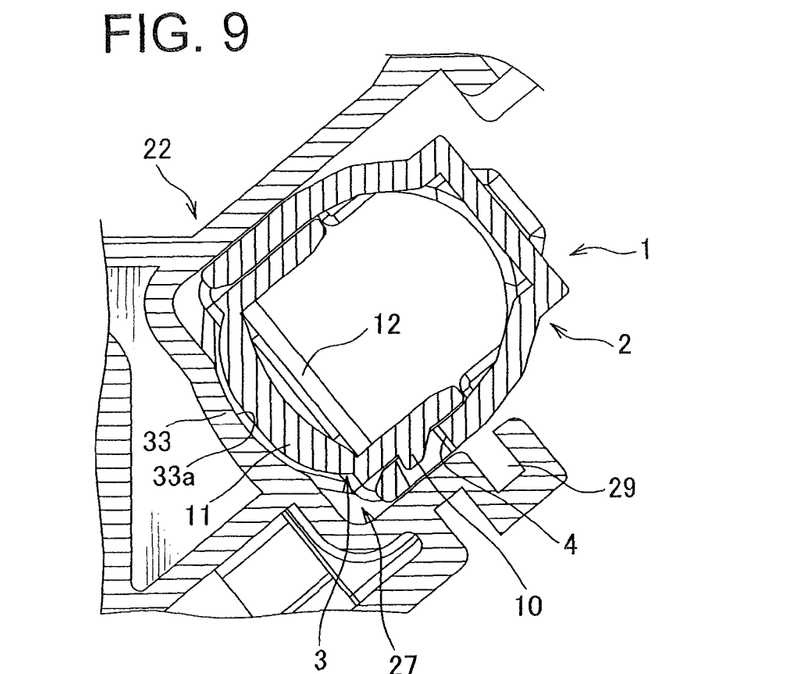
FIG. 9 is a cross sectional view along the line D-D of FIG. 5.

Referring to FIG. 9 showing a cross sectional view along the D-D line of FIG. 5, the outer face of the rear wall 11 having the arch-like (i.e. curved) cross-section of the rear split cover 3 of the wire cover 1 is arranged in contact with or adjacent to the central inner face 33a having the arch-like (i.e. curved) cross-section of the back wall 33 of the groove 27 of the frame 22. Thus, the lower face (i.e. outer face) of the step portion 12 of the rear split cover 3 functions as a water-stop face against water entering from the bottom along the back wall 33 of the groove 27.

In the above-described exemplary embodiment, the electrical junction box is composed of the frame 22, the junction block, the outer cover, the upper cover, the lower cover and the wire cover (i.e. the side cover) 1; however, the electrical junction box may not include the frame 22, instead it may include a lower cover (i.e. a main cover), an upper cover and electrical components and bus bars and such arranged within the lower cover, wherein a recessed wall 26 may be integrally formed on a side wall of the lower cover, and a groove 27 may be arranged in the recessed wall 26, wherein a wire cover 1 may be slidably mounted in the groove 27, the recessed wall 26 may be covered with the outer cover, and an upper portion of the outer cover may be covered with the upper cover. Alternatively, the groove 27 may be directly formed on the frame 22 or on the side wall of the lower cover, and without using the outer cover, the upper cover may be used to directly cover an upper portion of the wire cover 1. In any case, a lower portion of the wire cover 1 should not be covered with the lower cover and should be exposed.

Moreover, in the above-described exemplary embodiment, the wire cover 1 is composed of the front split cover 2 and the rear split cover 3; however, if the insertion of the electric wire 19 having the terminal can be accomplished easily, for example in case of the terminal of the electric wire 19 being other than a L-shaped terminal or a broad terminal, it is not necessary to divide the wire cover 1 into the front and the rear split covers 2, 3, instead the wire cover 1 may be formed in a single tubular-shape with synthetic resin.

Furthermore, in the above-described embodiment, the locking protrusion 14 is arranged below the flange 16; however, it is possible to form a locking portion such as the locking portion 14 at other arbitral location, and may eliminate the cutout portion 17 at the flange 16 so the flange 16 may be formed continuously along a circumference direction. Furthermore, if there is low chance of being wet by water, it is possible to eliminate the flange 16 and the water may be stopped using only the step portion 12 alone or only the step portions 12, 15a.

Furthermore, in the above-described embodiment, the step portion 12 is provided at the wire cover 1; however, instead of providing the step portion 12 at the wire cover 1, a step portion which is similar to the step portion 12 and which has a horizontal or substantially horizontal lower face may be formed on the back wall 33 of the groove 27 of the junction box main body, i.e. the frame 22. In this case also, the wire cover 1 may be provided with the flange 16 and the locking protrusion 14 arranged below (but not necessarily below) the flange 16.

As described above, by utilizing the waterproof structure of the wire cover of the electrical junction box according to the present invention, for example small number of electric wires which are lead out of an electrical junction box mounted on a motor vehicle and such can be covered and protected by a wire cover (i.e. a side cover), while preventing the water from entering into the electrical junction box from bottom through the electric wire by using a simple, inexpensive structure and by using only the wire cover and not using a component such as a waterproof packing. Therefore, the inside of the electrical junction box can securely be prevented from rust or connection failure.

The embodiments described herein are only representative embodiments and are not intended to limit the present invention. It will be understood that various modifications to the embodiments may be made without departing the scope of the present invention.

LIST OF REFERENCE SIGNS

1 wire cover
2 front split cover
3 rear split cover
11 rear wall
12, 15a step portion
13 taping portion
14 locking protrusion
16 flange
19 electric wire
22 frame (junction box main body)
26 recessed wall (outer wall)
27 groove

What is claimed is:

1. A waterproof structure of an electrical junction box including
    a junction box main body and a tubular wire cover, the junction main body having a groove formed on an outer wall of the junction box main body, and the wire cover being slidably engaged with the groove of the junction box main body,
    wherein an electric wire is passed downward through the wire cover and fixed to a taping portion located at a lower portion of the wire cover using a tape, the waterproof structure comprising a step portion as a water stop formed integrally on a rear wall of the wire cover,
    wherein the rear wall of the wire cover is arranged in contact with or adjacent to a back wall of the groove of the junction box main body, and the wire cover and the back wall of the groove are positioned apart to each other so as to form a space below the step portion, so that a bottom face of the step portion, the bottom face being formed in a horizontal or a substantially horizontal manner, serves as a water stop face that prevents water from entering into the electrical junction box from bottom along the back wall of the groove through the electric wire.

2. The waterproof structure of the electrical junction box according to claim 1, wherein the rear wall has a curved cross section, and the step portion is arranged at a bottom end of the rear wall and on both widthwise sides of the rear wall, wherein the step portion at the bottom end of the rear wall is continuous with the taping portion located at the lower portion of the wire cover.

3. The waterproof structure of the electrical junction box according to claim 1, further comprising a flange as a water stop provided at an upper end of the wire cover so that the flange abuts on an upper edge of the groove.

4. The waterproof structure of the electrical junction box according to claim 2, further comprising a flange as a water stop provided at an upper end of the wire cover so that the flange abuts on an upper edge of the groove.

5. The waterproof structure of the electrical junction box according to claim 3, further comprising a locking protrusion provided at the rear wall of the wire cover below the flange so that the locking protrusion engages with the back wall of the groove.

6. The waterproof structure of the electrical junction box according to claim 4, further comprising a locking protrusion provided at the rear wall of the wire cover below the flange so that the locking protrusion engages with the back wall of the groove.

7. The waterproof structure of the electrical junction box according to claim 1, wherein the wire cover is composed of a front split cover and a rear split cover which are combined together to form the wire cover,     wherein the rear split cover is provided with the step portion, a flange and a locking protrusion, the flange being arranged at an upper end of the rear split cover so that the flange abuts on an upper edge of the groove, and the locking protrusion being arranged at the rear wall of the wire cover below the flange so that the locking protrusion engages with the back wall of the groove.

8. The waterproof structure of the electrical junction box according to claim 2, wherein the wire cover is composed of a front split cover and a rear split cover which are combined together to form the wire cover,     wherein the rear split cover is provided with the step portion, a flange and a locking protrusion, the flange being arranged at an upper end of the rear split cover so that the flange abuts on an upper edge of the groove, and the locking protrusion being arranged at the rear wall of the wire cover below the flange so that the locking protrusion engages with the back wall of the groove.

\* \* \* \* \*